United States Patent
Delano et al.

(10) Patent No.: US 11,081,635 B1
(45) Date of Patent: Aug. 3, 2021

(54) METHOD AND APPARATUS FOR DRIVING A PIEZOELECTRIC TRANSDUCER WITH STORED CHARGE RECOVERY

(71) Applicant: Maxim Integrated Products, Inc., San Jose, CA (US)

(72) Inventors: Cary L. Delano, Los Altos, CA (US); Timothy A. Dhuyvetter, Arnold, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 619 days.

(21) Appl. No.: 15/950,149

(22) Filed: Apr. 10, 2018

Related U.S. Application Data

(60) Provisional application No. 62/483,876, filed on Apr. 10, 2017.

(51) Int. Cl.
   *H01L 41/04* (2006.01)
   *H02N 2/06* (2006.01)

(52) U.S. Cl.
   CPC .......... *H01L 41/042* (2013.01); *H02N 2/067* (2013.01)

(58) Field of Classification Search
   CPC ..... H02M 3/1582; H01L 41/042; H02N 2/067
   See application file for complete search history.

(56) References Cited

U.S. PATENT DOCUMENTS

| | | | |
|---|---|---|---|
| 6,055,168 A * | 4/2000 | Kotowski | H02M 3/07 307/110 |
| 7,474,035 B2 | 1/2009 | Fukagawa et al. | |
| 8,305,061 B1 * | 11/2012 | Zhang | H02M 3/1582 323/283 |
| 9,000,690 B2 * | 4/2015 | Garg | B06B 1/0238 318/116 |
| 9,270,205 B2 | 2/2016 | Gardner et al. | |
| 9,349,937 B2 | 5/2016 | Otsuka et al. | |
| 9,855,741 B2 | 1/2018 | Otsuka et al. | |
| 10,199,555 B2 * | 2/2019 | Chaput | H02M 7/537 |
| 2014/0246908 A1 * | 9/2014 | Chew | H02M 3/158 307/24 |
| 2016/0067963 A1 * | 3/2016 | van Brocklin | B41J 2/04541 347/10 |
| 2016/0205471 A1 * | 7/2016 | Yasuda | H03G 3/20 381/100 |

* cited by examiner

*Primary Examiner* — Emily P Pham
(74) *Attorney, Agent, or Firm* — TIPS Group

(57) ABSTRACT

A piezo driver system including a driver including a switching amplifier coupling a power port to a driver port, a battery coupled to the power port, a piezo device coupled to the driver port, where the switching amplifier provides a filtered driver signal to the driver port and returns stored charge from the piezo device to the battery. A method for driving a piezo device includes multiplying an input signal by an oscillator signal to provide a control signal, controlling a switching amplifier in accordance with the control signal to provided a filtered alternating current (AC) driver signal and a returned charge direct current (DC) signal, applying the filtered driver signal to a piezo device, and returning stored charge of the piezo device to a battery.

17 Claims, 6 Drawing Sheets

METHOD AND APPARATUS FOR DRIVING A PIEZOELECTRIC TRANSDUCER WITH STORED CHARGE RECOVERY

CROSS REFERENCE TO RELATED APPLICATIONS

This application claims the benefit of U.S. Ser. No. 62/483,876, filed Apr. 10, 2017, incorporated herein by reference.

BACKGROUND

The piezoelectric effect is understood as the linear electromechanical interaction between the mechanical and electrical states in crystalline materials with no inversion symmetry. The piezoelectric effect is a reversible process in that materials that exhibit the direct piezoelectric effect (the internal generation of electrical charge resulting from an applied mechanical force) also exhibit the reverse piezoelectric effect (the internal generation of a mechanical strain resulting from an applied electrical charge).

A piezoelectric transducer device ("piezo device") operates on the principals of the direct and/or reverse piezoelectric effects and can be used for many purposes. For example, piezo devices can form parts of sensors, actuators, motors, microphones, speakers, and haptic feedback devices, to name a few. Amplifiers (e.g., an input of the amplifier) are often coupled to piezo devices that operate in a direct piezoelectric effect mode (e.g. sensors), while drivers (e.g., an output of the driver) are typically coupled to piezo devices that are operating in a reverse piezoelectric effect mode (e.g. haptic feedback devices).

Piezo devices can be electrically modeled as capacitors when operated in the reverse piezoelectric effect mode in that the applied electrical energy is stored in the mechanical deflection of the transducer. When piezo devices are used in an alternating current (A.C.) mode their reactance tends to reduce the power efficiency of their drivers in that the electrical power discharged from the piezo devices is typically shunted to ground.

Haptic feedback technology may incorporate piezo devices (e.g., piezoelectric components) that are configured to generate a vibration in response to an electrical signal to generate haptic and/or audio feedback. For example, piezo drivers are utilized to drive a piezo device during the operation of a mobile computing device. Piezo drivers typically build a voltage across the piezo devices by forcing current to the piezo device to build electric charge across the component. In some circumstances, a control module determines that a voltage reduction across the piezo device is necessary. In these circumstances, the piezo drivers dump the stored electric charge to ground. When the piezo device generates haptic and/or audio feedback, the volt age across the piezo device increases and decreases many times, which causes inefficient usage of the electric charge.

For example, both the TI-DRV8662 and TI-DRV2667 haptic drivers of Texas Instruments Incorporated of Dallas, Tex. ("Texas Instruments") use a linear amplifier to power a piezo device which, as noted above, is a capacitive load. Both when charging and discharging the capacitive load, there is high dissipation in the form of heat of the current flowing through the linear amplifier of these Texas Instrument devices.

Texas Instruments also markets a driver under parts number TI-DRV2700 which includes a voltage booster and a class AB amplifier. A piezo device is coupled directly to the booster, and discharges its capacitive load to ground through resistors, again resulting in high energy dissipation. Nonetheless, the TI-DRV2700 only has about ½ of the dissipation of the TI-DRV2667.

Maxim Integrated Products, Inc. of San Jose, Calif. ("Maxim"), markets a MAX11836 haptics driver that charges the capacitive load of a piezo device with an efficient DC-DC booster and that discharges the capacitive load through a transistor. The energy dissipation of the MAX11836 driver is comparable to that of the TI-DRV2700 driver, which is again only about ½ of the dissipation of the TI-DRV2667 driver.

In U.S. Pat. No. 8,773,196, a resource pooling amplifier shares one or more inductors, either by switching the inductor or inductors among more than one load terminal at the same time, or by using the inductor or inductors for than more than one purpose at different times.

In U.S. Pat. No. 8,963,400, owned by the assignee of the present application, a piezo driver having recharging capability is configured to transfer electric charge from the piezo device to a passive energy storage component during various operational states of the piezo driver. It is disclosed that, in some configurations, the piezo driver with recharging capability can improve efficiency by at least twenty percent (20%) as compared to the efficiency of piezo drivers that discharge a piezo device to ground.

Haptic transducers are being increasingly used in battery powered devices such as mobile telephones. For example, haptic transducers are used in cell phones to provide tactile feedback during text entry. Since battery power is inherently limited, it is desirable to reduce the power consumption of piezo devices drivers without any loss in their functionality.

These and other limitations of the prior art will become apparent to those of skill in the art upon a reading of the following descriptions and a study of the several figures of the drawing.

SUMMARY

In an embodiment, set forth by way of example and not limitation, a piezo driver system includes a driver having a power port and a driver port; power storage device (e.g., a battery, a capacitor, or other source of electrical power) coupled to the power port; and a piezo device coupled to the driver port. The driver alternatively charges the piezo device with current drawn from the power storage device and discharges the piezo device to develop a recovered charge for the power storage device. In one embodiment there is a single-ended connection between the driver port and the piezo device, and in another embodiment there is a differential bridged connection between the driver port and the piezo device. In one example embodiment the driver includes a class D amplifier, and in another example embodiment the driver includes a switching amplifier.

In another embodiment, set forth by way of example and not limitation, a piezo driver system includes: a driver having a power port and at least one driver port; a battery coupled to the power port; and one or more piezo devices coupled to one or more driver ports. In this non-limiting embodiment, the driver alternatively charges one or more piezo devices with current drawn from the battery and discharges one or more of the piezo devices to provide a recovered charge for the battery.

A method for driving a piezo device includes charging a piezo device with current drawn from a power storage device (e.g., a battery), and discharging the piezo device to provide a recovered charge for the power storage device.

This method is advantageous is that the energy of the discharge current from the piezo device is not wasted by being dissipated as heat but, rather, is used to regenerate the power storage device.

These and other embodiments, features and advantages will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the present application. The drawings are not necessarily to scale. In general, operations of disclosed processes may be performed in an arbitrary order, unless otherwise provided in the claims. The drawings include the following figures:

DETAILED DESCRIPTION OF EXAMPLE EMBODIMENTS

Figure 1:
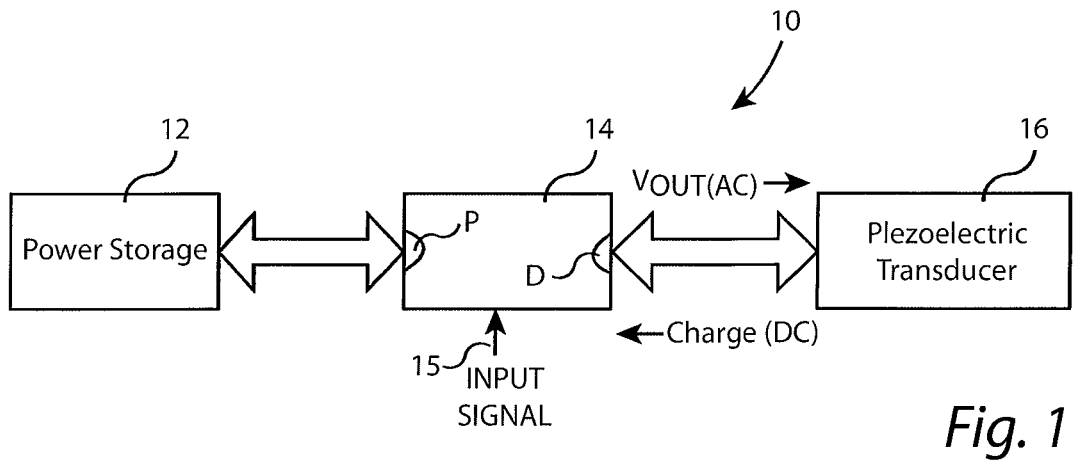
FIG. 1 is a block diagram of a piezo system.

FIG. 1 is a block diagram of a piezo system 10 including a power storage device 12 (e.g., a battery, a capacitor, or other source of electrical power), driver 14 and a piezoelectric transducer ("piezo device") 16. Power storage device 12 is, in certain embodiments, a battery (e.g., a D.C. battery), although on other, alternate embodiments can include a reactive storage power storage device, such as one or more inductors or one or more capacitors. Piezo device 16 can be any of a number of commercially available devices which serve as transducers, speakers, haptic feedback devices, etc. Driver 14 is controlled by an analog alternating current (A.C.) signal input 15 and draws charge from power storage device 12 via a power port P to charge the piezo device 16 via a driver port D and returns charge to power storage device 12 when the piezo device 16 discharges. Driver 14 is preferably implemented as a switching amplifier which is modulated to produce a filtered driver signal on driver port D and which returns stored charge to power storage device 12 from piezo device 16 via power port P. While the piezo device 16, in this embodiment, is charged with an A.C. current, it discharges with a strong D.C. component which can be applied to the battery 12 to increase the charge on the battery.

Figure 2:
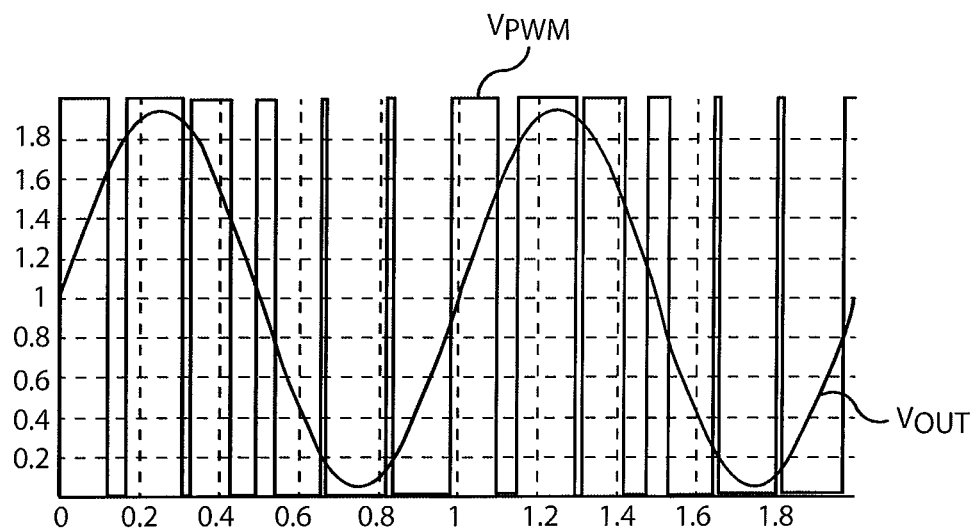
FIG. 2 is a graph illustrating an analog signal and a related pulse width modulated digital signal.

FIG. 2 is a graph illustrating a filtered driver signal $V_{OUT}$ developed on driver port D of driver 14 and a pulse train $V_{PWM}$ which, by way of example, can be about five times the frequency of the driver signal $V_{OUT}$. As can be seen, the pulse width modulated (PWM) signal $V_{PWM}$ can be generated and filtered within the driver 14 to produce an "analog" or alternating current (A.C.) signal $V_{OUT}$, represented herein as a sine wave, that is an amplified version of the input signal 15.

Figure 3:
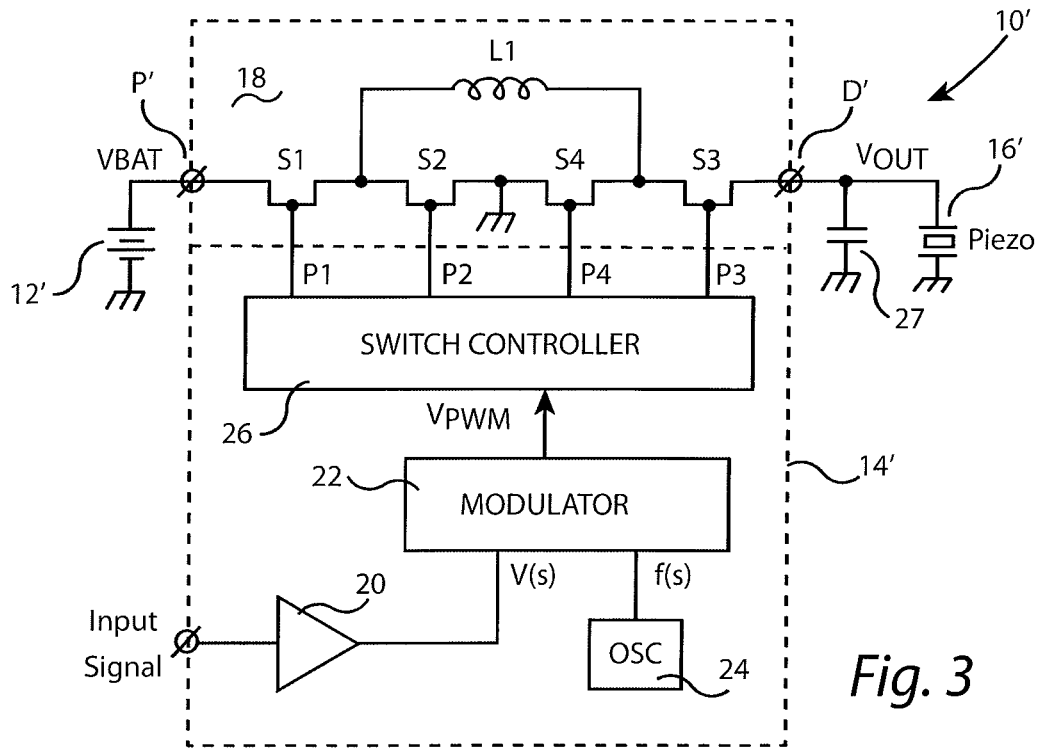
FIG. 3 is a block diagram of a first embodiment of the piezo system of FIG. 1.

FIG. 3 is a block diagram of a first example piezo system 10', set forth by way of example an not limitation, which includes a battery 12', a driver 14', and a piezo device 16'. Driver 14', in this non-limiting example, includes a buck-boost switching converter 18 including an inductor L1 and four switches S1, S2, S3 and S4, where the switches S1-S4 are preferably implemented by with transistors, e.g. MOSFET transistors. In this non-limiting example, the switching converter 18 operates as a switching amplifier to boost the voltage of battery 12' as applied to power port P' to about 120+ volts on driver port D'. As will be appreciated by those of skill in the art, switching converter 18 can take the form of other types of switching amplifiers, e.g. a boost converter. A smoothing capacitor 27 can be coupled to driver port D' to further smooth the filtered driver signal $V_{OUT}$.

In the non-limiting example of FIG. 3, the driver 14' further includes an input signal buffer 20, a modulator 22, an oscillator 24, and a switch controller 26. An input signal is applied to buffer 20 to develop an signal V(s) as an input to modulator 22. Oscillator 24 produces an oscillator signal f(s) (a/k/a "pulse train") as another input to modulator 22. In this example, modulator 22 multiplies the two input signals to produce a pulse width modulated signal $V_{PWM}$, which is applied to switch controller 26 to control the switches S1, S2, S4 and S3 via outputs P1, P2, P4 and P3, respectively, coupled to their gates.

Figure 4:
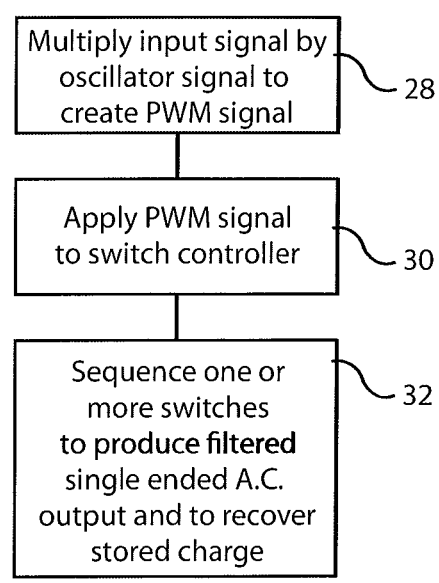
FIG. 4 is a flow diagram illustrating an operation of the piezo system of FIG. 3.

FIG. 4 is a flow diagram illustrating an operation of the piezo system 10' of FIG. 3. In this example, in an operation 28, an input signal V(s) is multiplied by an oscillator signal f(s) to develop a pulse width modulated signal $V_{PWM}$. Next, in an operation 30, the signal $V_{PWM}$ is applied to switch controller 26 which, in an operation 32, sequences one or more switches to produce a filtered, single-ended A.C. output $V_{OUT}$ and to recover stored charge from the piezo device. In an example embodiment, during the charging state, switches S1 and S4 are switched ON by the switch controller 26, thereby sampling power from the battery.

Figure 5:
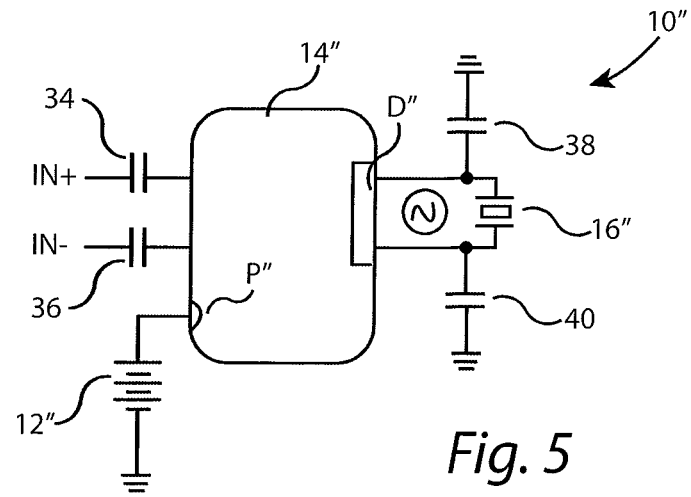
FIG. 5 is a block diagram of a second embodiment of the piezo system of FIG. 1.

FIG. 5 is a block diagram of a second example piezo system 10", set forth by way of further example, which includes a battery 12", a driver 14", and a piezo device 16". In this embodiment, the driver 14" includes a switching amplifier (e.g. a buck-boost converter or a boost converter) which can directly drive the capacitive load of the piezo device 16". The D.C. voltage at a power port P" is converted by the driver 14" to provide an analog A.C. current $V_{OUT}$ at a differential driver port D". The system 10" further includes capacitors 34 and 36 for IN+ and IN− and high frequency shunt capacitors 38 and 40 coupled to the differential driver port D".

Figure 6:
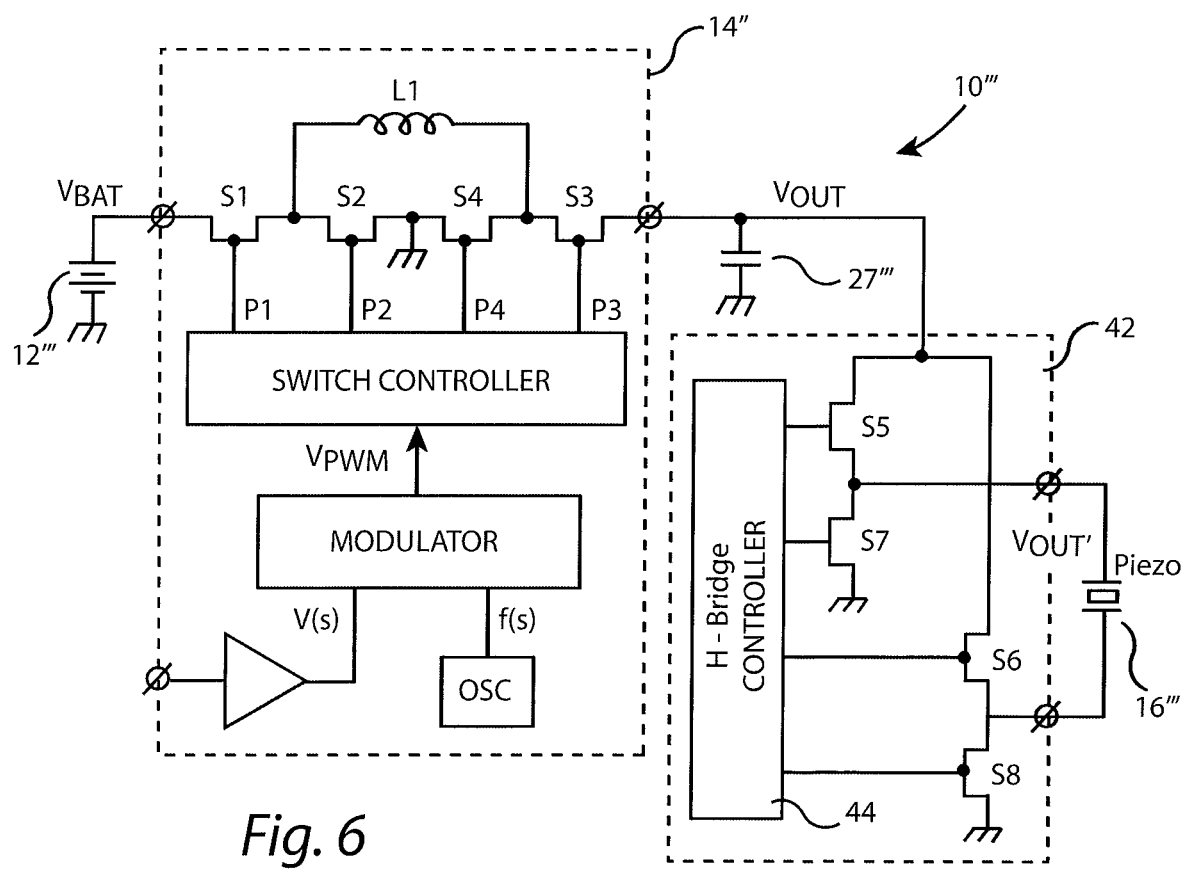
FIG. 6 is a block diagram of a third embodiment of the piezo system of FIG. 1.

FIG. 6 is block diagram of a third example piezo system 10'", including a battery 12'", the driver 14" of FIG. 3, and a smoothing capacitor 27". The piezo system 10'" further includes a differential bridge 42 which converts the single-ended $V_{OUT}$ output signal of the driver 14" to a differential $V_{OUT'}$ output signal for a piezo device 16'''. In this example, the differential bridge 42 includes four switches S5-S8 that are controlled by an H-Bridge controller 44 to convert the single-ended output of the driver 14'' to a differential output for the piezo device 16'''. The manufacture and operation of differential bridges, such as differential bridge 42, are well known to those of skill in the art.

In the embodiment of FIG. 6, a single capacitor 27''' replaces dual capacitors 38 and 40 of the embodiment of FIG. 4. It will therefore be appreciated that the embodiments of FIGS. 3 and 6 require very few reactive components, e.g. a single inductor and optionally one or more capacitors. It will also be noted that the embodiments of both FIGS. 3 and 6 are preferably provided with both analog and digital inputs for haptic waveform signals and exhibit relatively low distortions of about 1%.

Figure 7:
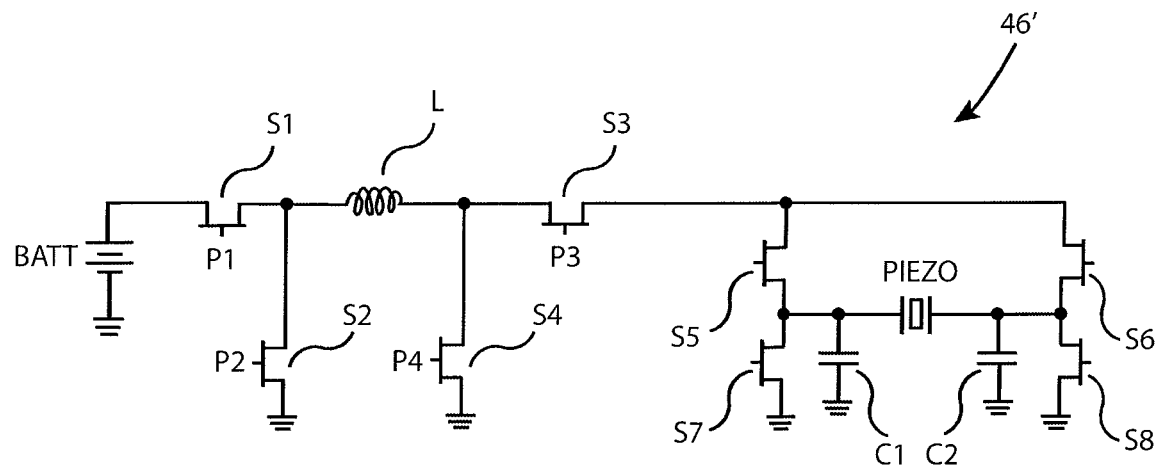
FIG. 7 is a schematic representation of a first embodiment of a power stage for a piezo system.

FIG. 7 is a schematic representation of first embodiment of a power stage 46 for a piezo system. In this example, a battery BATT is coupled a number of DMOS FET switches S1-S8 such that it can either provide an A.C. current to charge the piezo device PIEZO or receive a D.C. discharge current from the piezo device PIEZO for the purpose to recharge the battery BATT.

With continuing reference to FIG. 7, an inductor L serves to attenuate high frequency components of the current, while capacitors C1 and C2 serve to shunt high frequency components of the current to ground. It should be noted that the FET of switch S2 can be a relatively small device, and that switch S4 can be eliminated if switches S5 and S6 are tied to the maximum voltage (for p-channel devices) or the lowest voltage (for n-channel devices).

It should be noted that switches S1, S2, S3, S4 and L of power stage 46 can operate as a buck-boost converter. For example, to increase the inductor current, S1 and S3 turn on (with S2 and S4 off). Then switches S2 and S4 turn on and S1 and S3 turn off to decrease the inductor current. Switches S5, S6, S7 and S8 alternate the polarity of the final out signal to the piezo when needed. In an embodiment, set forth by way of example and not limitation, the node connecting switches S5, S5 and S6 are controlled by a modulator to produce a full wave rectified version of the input signal. The output switches S5, S6, S7 and S8 can convert this into a clean differential signal by transitioning at the zero crossings.

Figure 8:
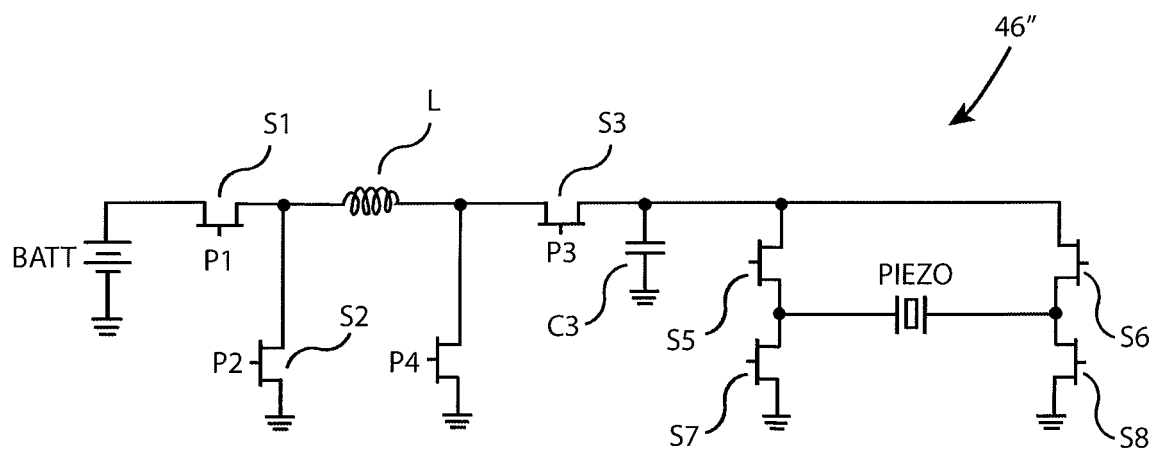
FIG. 8 is a schematic representation of a second embodiment of a power stage for a piezo system.

FIG. 8 is a schematic representation of second embodiment of a power stage 46'' for the piezo system. It is configured and operates in a similar manner as power stage 46', described above, except that the two capacitors C1 and C2 of FIG. 7 are replaced with a single capacitor C1.

Figure 9:
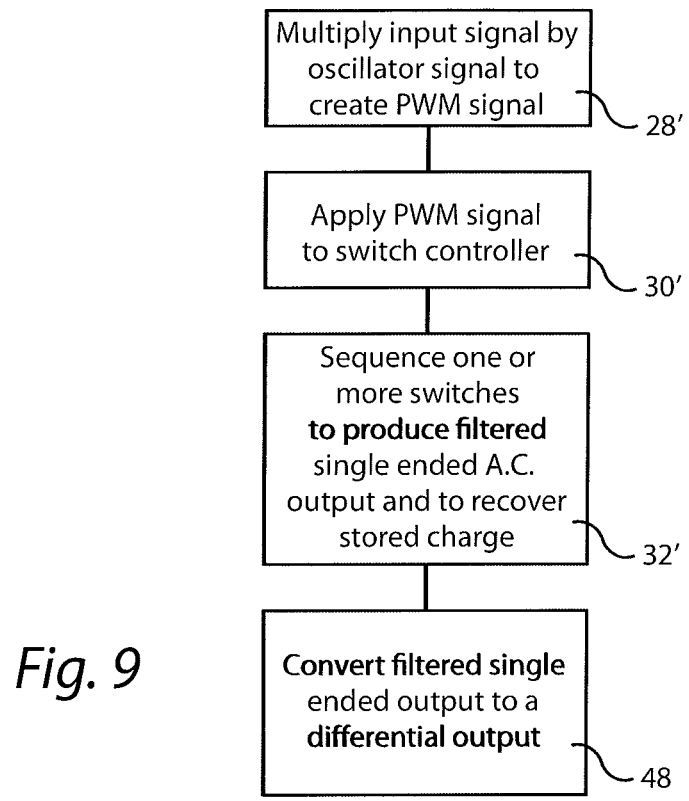
FIG. 9 is a flow diagram illustrating an operation of the piezo system of FIG. 6.

FIG. 9 is a flow diagram illustrating an example operation of the piezo system 10''' of FIG. 6. In this example, in an operation 28' an input signal V(s) is multiplied by an oscillator signal f(s) by the modulator 22 to develop a pulse width modulated signal $V_{PWM}$. Next, in an operation 30', the signal $V_{PWM}$ is applied to switch controller 26 which, in an operation 32', sequences one or more switches to produce a filtered, single-ended A.C. output $V_{OUT}$ and to recover stored charge from the piezo device. In an operation 48, the single-ended output is converted to a differential output.

Figure 10:
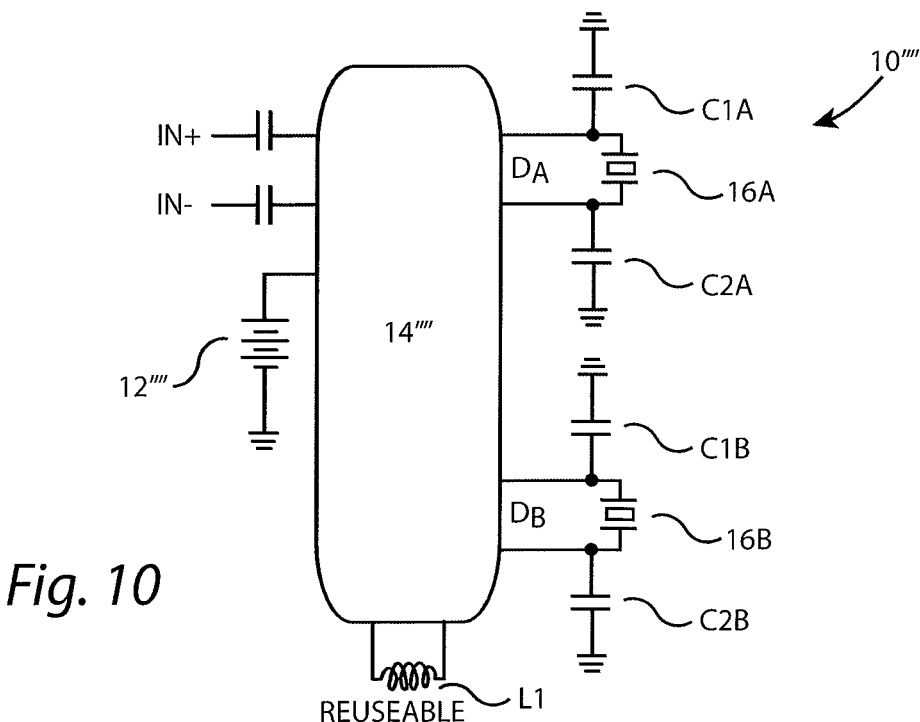
FIG. 10 is a block diagram of a fourth embodiment of a piezo system.

FIG. 10 is a block diagram of a fourth example piezo system 10'''', which includes a battery 12'''', a driver 14'''' and a plurality of outputs, here illustrated by two differential driver ports $D_A$ and $D_B$, coupled to two piezo devices 16A and 16B, respectively. It should be noted that, in this non-limiting example, the operation of driver 14'''' is based on similar principles to the operation of example drivers described above, e.g. it uses efficient switching amplifiers to charge the piezo devices. The outputs of the driver 14'''' at ports $D_A$ and $D_B$ preferably filtered "analog" alternating current (AC) signals, as described above, that can be directly coupled to the piezo devices 16A and 16B, respectively. In this non-limiting example, an inductor L1 is "reusable" in that it can be used to serve the plurality of outputs (e.g. two or more outputs) by time sharing the inductor, e.g. by employing a Single Inductor Multiple Output (SIMO) converter (not shown) in the driver 14''''. In this embodiment, capacitors C1A and C2A couple nodes of piezo device 16A to ground, and capacitors C1B and C2B couple nodes of piezo device 16B to ground, as described above with respect to other embodiments.

Figure 11:
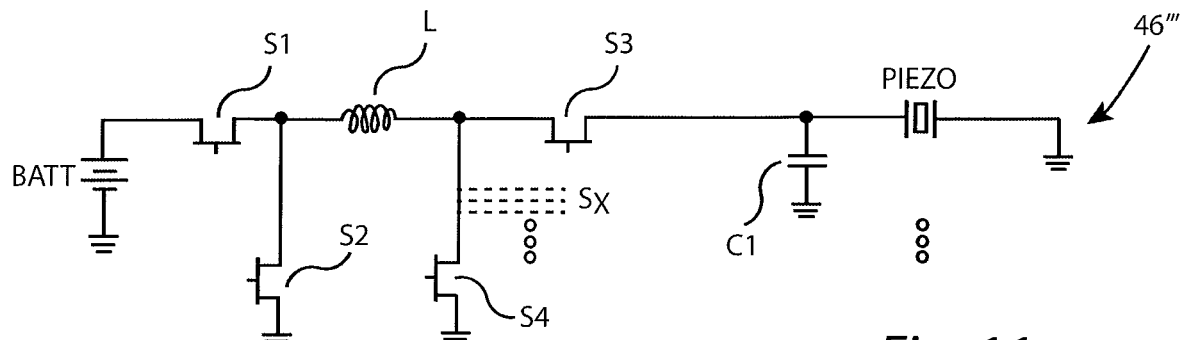
FIG. 11 is schematic representation of a third embodiment of a power stage for a piezo system.

FIG. 11 is schematic representation of a third embodiment of a power stage 46''' for a piezo system and includes a number of switches S1-S4 made, for example, by MOSFET technology. The FET of switch S2 can be relatively small. A piezo device PIEZO is coupled to switch S3 and to a capacitor C, where the FET of switch S3 and the load comprising capacitor C and piezo device 16 comprise a channel. Additional channels comprising similar FETS/Loads as represented by channels Sx. The capacitor C, in some embodiments, can be replaced by the inherent capacitance of piezo device 16. This example power stage 46''' operates substantially as described above.

Figure 12:
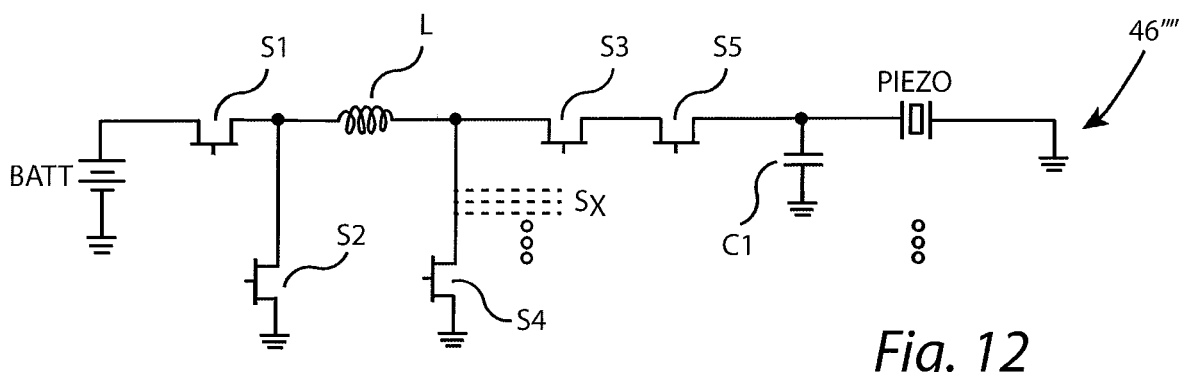
FIG. 12 is a schematic representation of a fourth embodiment of a power stage for a piezo system.

FIG. 12 is a schematic representation of a fourth embodiment of a power stage 46'''' for a for piezo driver, which is essentially the same as the power stage 10''' of FIG. 11, but with the addition of an additional switch S5 for each channel Sx. Switch S5 provides the option of decoupling a load from a channel, which can be useful when more than one load is active at the same time.

Figure 13:
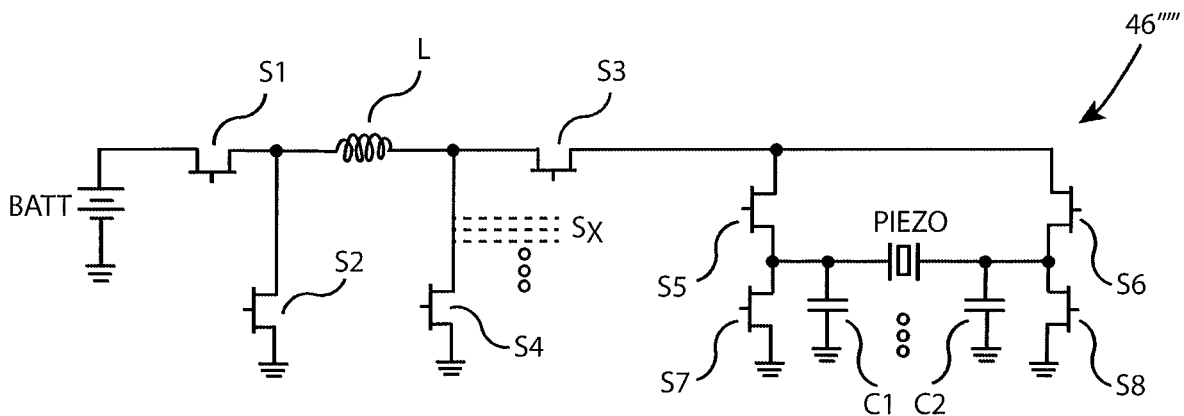
FIG. 13 is a schematic representation of a fifth embodiment of a power stage for a piezo system.

FIG. 13 is a schematic representation of a fifth embodiment of a power stage 46'''' for piezo driver. This is a "bridged" example, and it operates similarly to the bridged examples described previously, with the exception of additional FETs/Loads in the form of multiple channels Sx, as described above.

Although various embodiments have been described using specific terms and devices, such description is for illustrative purposes only. The words used are words of description rather than of limitation. It is to be understood that changes and variations may be made by those of ordinary skill in the art without departing from the spirit or the scope of various inventions supported by the written disclosure and the drawings. In addition, it should be understood that aspects of various other embodiments may be interchanged either in whole or in part. It is therefore intended that the claims be interpreted in accordance with the true spirit and scope of the invention without limitation or estoppel.

What is claimed is:

1. A piezo driver comprising:
   a switching converter comprising,
   an inductor having a first node and a second node;
   a first switch coupling the first node to ground;
   a second switch coupling the second node to ground;
   a third switch coupling the first node a power port; and
   a fourth switch coupling the second node to a driver port;
   a switch controller having a plurality of switch control outputs coupled to the first switch, the second switch, the third switch and the fourth switch of the switching converter;
   an oscillator creating an oscillator signal f(s); and
   a modulator having a first input coupled to an input signal V(s), a second input coupled the oscillator signal f(s), and an output coupled to the switch controller, wherein the modulator multiplies the input signal V(s) by the oscillator signal f(s) to provide a pulse width modulated pulse train $V_{PWM}$;

wherein the first switch, the second switch, the third switch and the fourth switch are controlled by the pulse width modulated pulse train $V_{PWM}$ to provide a filtered alternating current driver signal at the driver port for a piezo device and to return stored charge of the piezo device to a battery connected to the power port.

2. The piezo driver of claim 1 further comprising a smoothing capacitor coupled to the driver port.

3. The piezo driver of claim 2 and further comprising a single-ended connection between the driver port and the piezo device.

4. The piezo driver of claim 2 and further comprising a differential bridged connection between the driver port and the piezo device.

5. The piezo driver of claim 4 wherein the differential bridged connection includes a differential bridge controller and a plurality of switches coupled to the differential bridge controller.

6. The piezo driver of claim 5 wherein the differential bridge controller is an H-Bridge controller.

7. The piezo driver of claim 1 wherein the switching converter operates as a switching amplifier to boost a voltage on the power port to a higher voltage on the driver port.

8. The piezo driver of claim 1 wherein the modulator has an input signal port for an input signal and an oscillator input port for an oscillator signal.

9. The piezo driver of claim 8 wherein the modulator has a control output port for a control signal that is coupled to a control input port of the switch controller.

10. The piezo driver of claim 9 wherein the input signal is a V(s) signal and the oscillator signal is an f(s) oscillator signal.

11. The piezo driver of claim 10 wherein the control signal is a V(PWM) control signal.

12. The piezo driver of claim 11 wherein the V(s) signal is multiplied by the f(s) signal to create the V(PWM) control signal.

13. A method for driving a piezo device comprising:
multiplying an input signal V(s) by an oscillator signal f(s) to provide a pulse width modulated pulse train $V_{PWM}$ control signal;
controlling a switching amplifier in accordance with the pulse width modulated pulse train $V_{PWM}$ control signal to provide a filtered alternating current (AC) driver signal and a returned charge direct current (DC) signal;
applying the filtered AC driver signal to the piezo device; and
returning stored charge of the piezo device to a battery with the DC signal.

14. The method for driving the piezo device as recited in claim 13 wherein the switching amplifier is one of a buck-boost converter or a boost converter.

15. A piezo driver system comprising:
a driver including
a switching amplifier coupling a power port to a plurality of driver ports;
a switch controller coupled to the switching amplifier;
an oscillator creating an oscillator signal f(s); and
a modulator having a first input coupled to an input signal V(s), a second input coupled the oscillator signal f(s), and an output coupled to the switch controller, wherein the modulator multiplies the input signal V(s) by the oscillator signal f(s) to provide a pulse width modulated pulse train $V_{PWM}$ signal;
a battery coupled to the power port; and
a plurality of piezo devices coupled to the plurality of driver ports;
wherein the driver provides a plurality of filtered driver signals to the plurality of piezo devices and returns stored charge of the plurality of piezo devices to the battery.

16. The piezo driver system of claim 15 further comprising:
a plurality of single-ended connections between the plurality of driver ports and the plurality of piezo devices.

17. The piezo driver system of claim 15 further comprising:
a plurality of differential bridged connections between the plurality of driver ports and the plurality of piezo devices.

* * * * *